(12) United States Patent
Kamakura et al.

(10) Patent No.: US 10,211,110 B1
(45) Date of Patent: Feb. 19, 2019

(54) METHOD OF MANUFACTURING SEMICONDUCTOR DEVICE

(71) Applicant: HITACHI KOKUSAI ELECTRIC INC., Tokyo (JP)

(72) Inventors: Tsukasa Kamakura, Toyama (JP); Kazuhide Asai, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/903,947

(22) Filed: Feb. 23, 2018

(30) Foreign Application Priority Data

Sep. 22, 2017 (JP) ................. 2017-182076

(51) Int. Cl.
*H01L 21/02* (2006.01)
*C23C 16/52* (2006.01)
*H01L 21/66* (2006.01)
*H01L 21/67* (2006.01)
*C23C 16/455* (2006.01)

(52) U.S. Cl.
CPC ........ *H01L 22/10* (2013.01); *C23C 16/45544* (2013.01); *C23C 16/52* (2013.01); *H01L 21/0228* (2013.01); *H01L 21/67276* (2013.01)

(58) Field of Classification Search
CPC ............. G05B 19/406; H01L 21/0228; H01L 21/02126
See application file for complete search history.

(56) References Cited

U.S. PATENT DOCUMENTS

2012/0253724 A1* 10/2012 Asai ................... G05B 23/0235
702/88
2016/0237568 A1* 8/2016 Itatani ..................... C23C 16/52

FOREIGN PATENT DOCUMENTS

JP          09-085076 A     3/1997
JP          2006-303414 A   11/2006

* cited by examiner

*Primary Examiner* — Changhyun Yi
(74) *Attorney, Agent, or Firm* — Volpe and Koenig, P.C.

(57) ABSTRACT

A method of manufacturing a semiconductor device includes supplying an inert gas into a process chamber; exhausting an internal atmosphere of the process chamber from an exhaust part; acquiring first data serving as reference data on a relationship between a flow rate of the inert gas and a pressure in one of the process chamber or the exhaust part; processing a substrate accommodated in the process chamber by supplying a processing gas into the process chamber; and adjusting exhaust characteristics by adjusting a valve opening degree of an exhaust regulating part installed in the exhaust part.

10 Claims, 11 Drawing Sheets

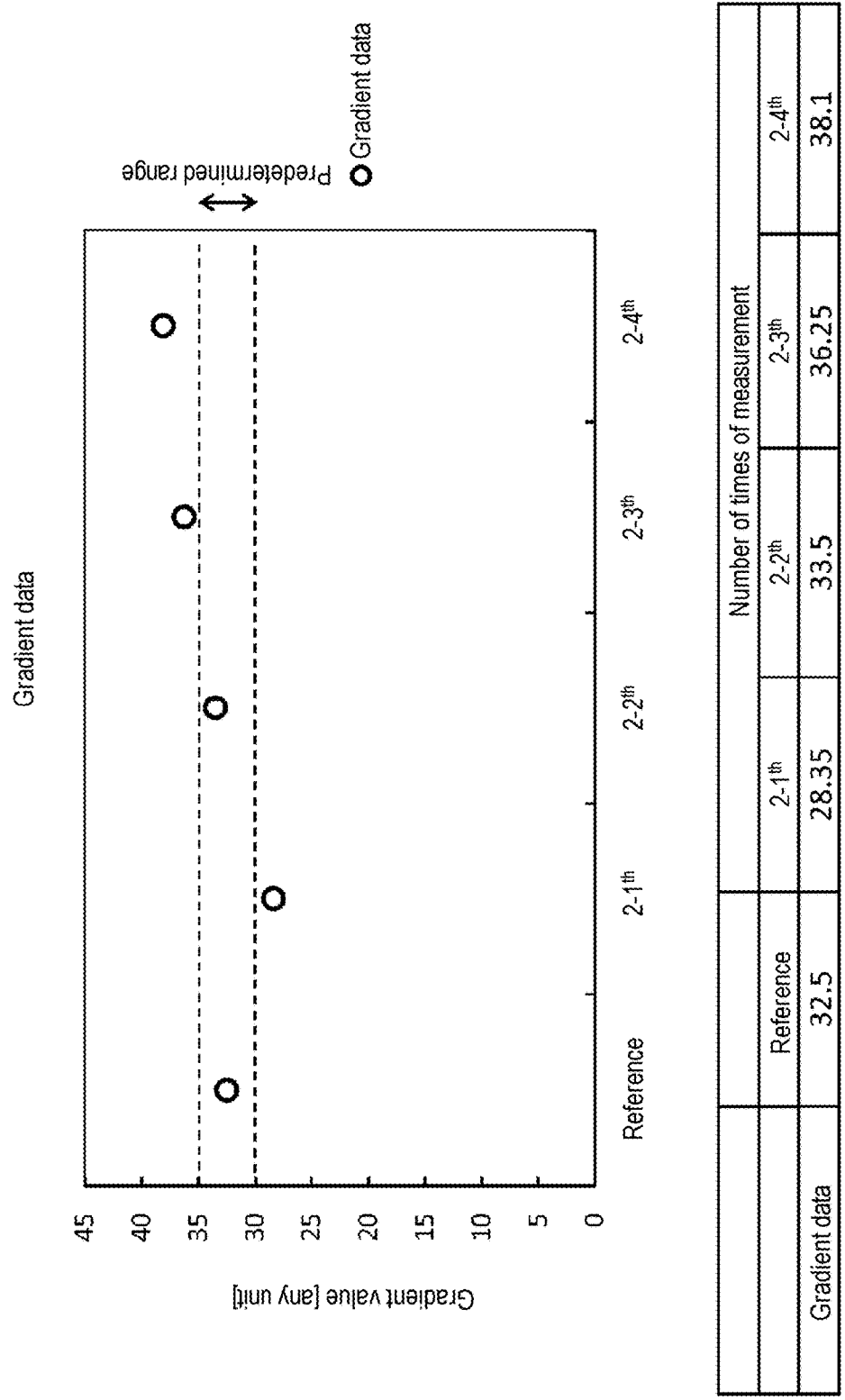

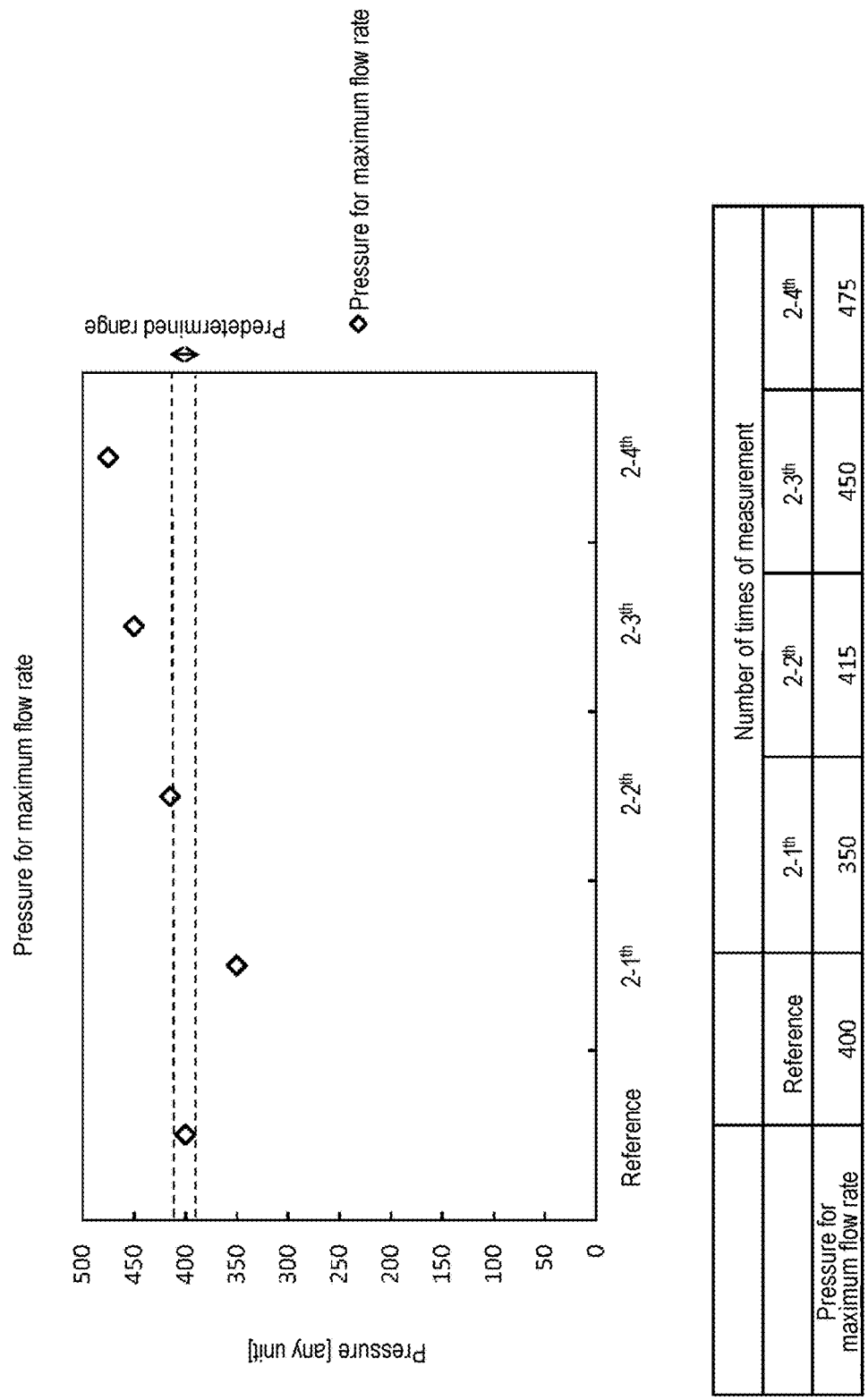

METHOD OF MANUFACTURING SEMICONDUCTOR DEVICE

CROSS-REFERENCE TO RELATED APPLICATION

This application is based upon and claims the benefit of priority from Japanese Patent Application No. 2017-182076, filed on Sep. 22, 2017, the entire contents of which are incorporated herein by reference.

TECHNICAL FIELD

The present disclosure relates to a method of manufacturing a semiconductor device.

BACKGROUND

With higher integration of semiconductor devices representative of large scale integrated circuits (LSIs), dynamic random access memories (DRAMs), flash memories and the like, miniaturization of circuit patterns and structures formed in a manufacturing process have been advanced. A substrate processing apparatus that performs one step of a process of manufacturing a semiconductor device is subjected to regular maintenance to maintain the performance of a substrate processing apparatus.

However, changes in the exhaust characteristics of a substrate processing apparatus may result in non-uniformity of the substrates.

SUMMARY

Some embodiments of the present disclosure provide a technique capable of improving processing uniformity for different substrates.

According to an aspect of the present disclosure, a method of manufacturing a semiconductor device includes: supplying an inert gas into a process chamber; exhausting an internal atmosphere of the process chamber from an exhaust part; acquiring first data serving as reference data on a relationship between a flow rate of the inert gas and a pressure in one of the process chamber or the exhaust part; processing a substrate accommodated in the process chamber by supplying a processing gas into the process chamber; and adjusting exhaust characteristics by adjusting a valve opening degree of an exhaust regulating part installed in the exhaust part, wherein the act of adjusting the exhaust characteristics includes: acquiring second data, which is measurement data on a relationship between the flow rate of the inert gas and a pressure measured in one of the process chamber or the exhaust part, by measuring the pressure while varying the flow rate of the inert gas with the valve opening degree of the exhaust regulating part set to a predetermined value; determining whether or not difference data between the first data and the second data is within a predetermined range, the difference data being obtained by comparing the second data with the first data; and changing the valve opening degree of the exhaust regulating part when the difference data is not within the predetermined range.

BRIEF DESCRIPTION OF DRAWINGS

FIG. 10 is an explanatory view showing an example of processing of a determination process according to an embodiment.

FIG. 11 is an explanatory view showing another example of the processing of the determination process according to an embodiment.

DETAILED DESCRIPTION

Figure 1:
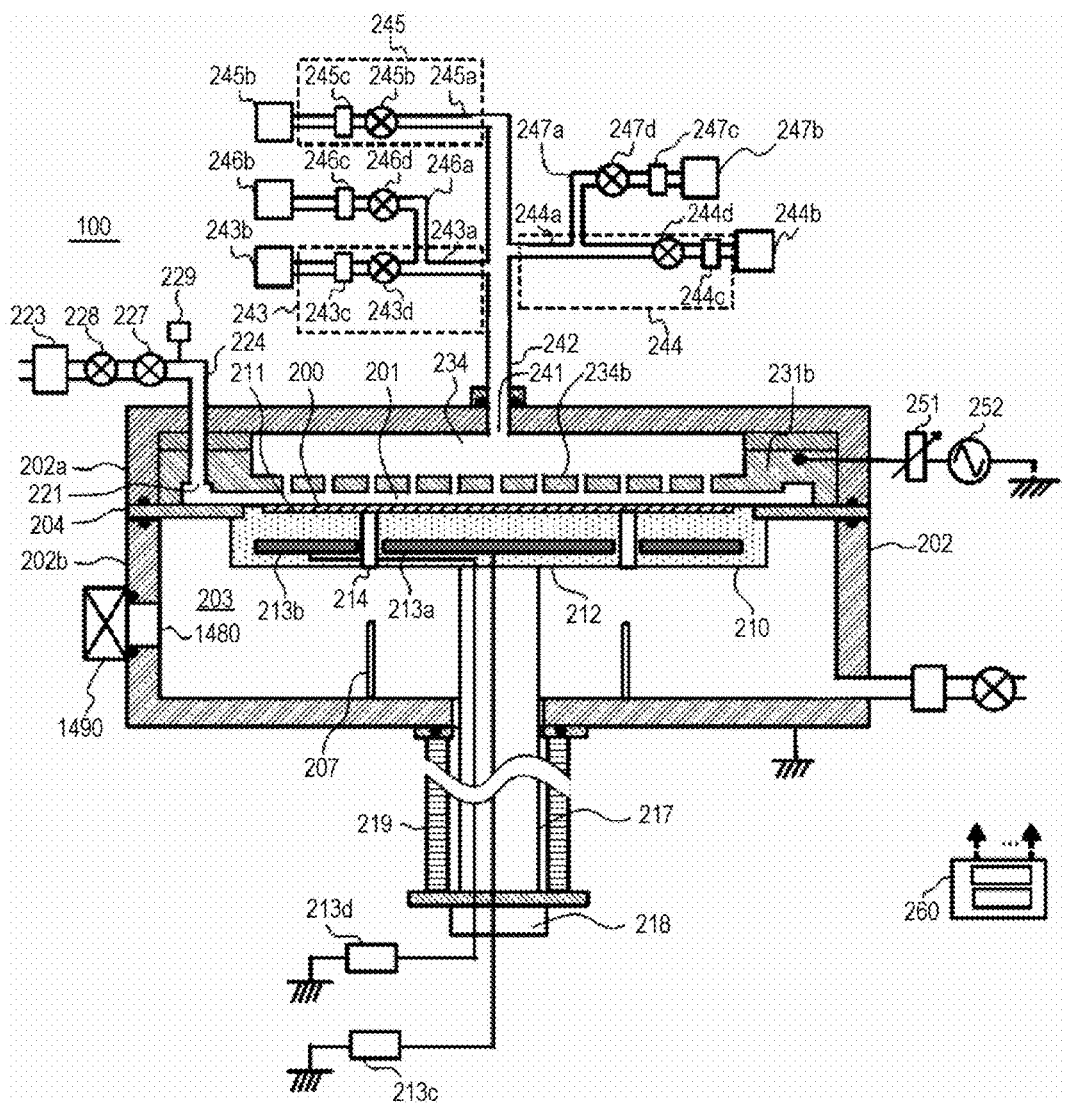
FIG. 1 is a view schematically showing the configuration of a substrate processing apparatus according to an embodiment.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

EMBODIMENTS

An embodiment of the present disclosure will be described below with reference to the drawings.

(1) Configuration of Substrate Processing Apparatus

First, the schematic configuration of a substrate processing apparatus according to an embodiment of the present disclosure will be described.

The substrate processing apparatus described here is used to perform, for example, a film forming process, which is one step in a process of manufacturing a semiconductor device.

(Processing Container)

As shown in FIG. 1, a substrate processing apparatus 100 includes a processing container 202. The processing container 202 is made of a metal material such as aluminum (Al) or stainless steel (SUS), or quartz and is formed as a flat closed container having a circular cross section. The processing container 202 is composed of an upper container 202a and a lower container 202b, with a partition 204 formed therebetween. A space surrounded by the upper container 202a above the partition 204 functions as a processing space (also referred to as a process chamber) 201 for processing a substrate 200 such as a silicon wafer (also simply referred to as a wafer) to be processed in a film forming process. On the other hand, a space surrounded by the lower container 202b below the partition 204 functions as a transfer space (also referred to as a transfer chamber) 203 for transferring the wafer 200. In order to function as the transfer chamber 203, a substrate loading/unloading port 1480 adjacent to a gate valve 1490 is formed in the side surface of the lower container 202b, and the wafer 200 is moved from/into a transfer chamber (not shown) via the substrate loading/unloading port 1480. A plurality of lift pins 207 is installed at the bottom of the lower container 202b. The lower container 202b is grounded.

(Substrate Support)

A substrate support (susceptor) 210 for supporting the wafer 200 is installed in the process chamber 201. The susceptor 210 includes a substrate mounting table 212 having a mounting surface 211 on which the wafer 200 is mounted. The substrate mounting table 212 incorporates at least heaters 213a and 213b as a heating part for adjusting the temperature of the wafer 200 on the mounting surface 211. In addition, through-holes 214 through which the lift pins 207 penetrate are formed in the substrate mounting table 212 at positions corresponding to the lift pins 207, respectively.

The heaters 213a and 213b as the heating part incorporated in the substrate mounting table 212 are configured to keep the wafer 200 on the mounting surface 211 at a predetermined temperature with temperature adjustment (heating or cooling) by supplying electric power. Such heaters 213a and 213b are separately installed in a plurality of regions into which the in-plane of the mounting surface 211 is divided, for example, in the inner circumference side and the outer circumference side of the mounting surface 211. Temperature adjustment parts 213c and 213d for respectively adjusting supply power to the heaters 213a and 213b are individually connected to the heaters 213a and 213b. The temperature adjustment parts 213c and 213d are independently controlled according to an instruction from a controller 260 to be described later. Thus, the heaters 213a and 213b are configured to perform zone control for performing independent temperature adjustment for each region on the wafer 200 on the mounting surface 211.

The substrate mounting table 212 is supported by a shaft 217. The shaft 217 penetrates the bottom of the processing container 202 and further is connected to an elevating instrument 218 outside the processing container 202. Then, the elevating instrument 218 can be operated to move the substrate mounting table 212 up/down. The periphery of the lower end portion of the shaft 217 is covered with a bellows 219 to air-tightly hold the interior of the process chamber 201.

When the wafer 200 is transferred, the substrate mounting table 212 is lowered to locate the substrate mounting surface 211 at a position of the substrate loading/unloading port 1480 (wafer transfer position). When the wafer 200 is processed, the wafer 200 is raised to a processing position (wafer processing position) in the process chamber 201. Specifically, when the substrate mounting table 212 is lowered to the wafer transfer position, the tops of the lift pins 207 protrude from the upper surface of the substrate mounting surface 211 to support the wafer 200 from below. When the substrate mounting table 212 is raised to the wafer processing position, the lift pins 207 are buried from the upper surface of the substrate mounting surface 211 such that the substrate mounting surface 211 supports the wafer 200 from below. Since the lift pins 207 are in direct contact with the wafer 200, they may be made of a material such as quartz or alumina.

(Gas Introduction Port)

A gas introduction port 241 for supplying various gases into the process chamber 201 is installed in the upper portion of the process chamber 201. The configuration of a gas supply part connected to the gas introduction port 241 will be described later.

In order to disperse a gas supplied from the gas introduction port 241 and uniformly diffuse the gas into the process chamber 201, a shower head (a buffer chamber) 234 with a dispersion plate 234b may be disposed in the process chamber 201 communicating with the gas introduction port 241.

A matching device 251 and a high frequency power supply 252 are connected to a support member 231b of the dispersion plate 234b so as to supply an electromagnetic wave (high frequency power or a microwave). Thereby, it is possible to excite the gas supplied into the process chamber 201 through the dispersion plate 234b to generate plasma. That is, the dispersion plate 234b, the support member 231b, the matching device 251 and the high frequency power supply 252 are used to generate plasma of a first processing gas and a second processing gas, which will be described later, and function as a portion of a first gas supply part (which will be described in detail later) and a portion of a second gas supply part (which will be described in detail later).

(Gas Supply Part)

A common gas supply pipe 242 is connected to the gas introduction port 241. A first gas supply pipe 243a, a second gas supply pipe 244a and a third gas supply pipe 245a are connected to the common gas supply pipe 242. The first processing gas (which will be described in detail later) is mainly supplied from the first gas supply part 243 including the first gas supply pipe 243a, and the second processing gas (which will be described in detail later) is mainly supplied from the second gas supply part 244 including the second gas supply pipe 244a. A purge gas is mainly supplied from the third gas supply part 245 including the third gas supply pipe 245a.

(First Gas Supply Part)

A first gas supply source 243b, a mass flow controller (MFC) 243c, which is a flow rate controller (flow rate control part), and a valve 243d, which is an opening/closing valve, are installed to the first gas supply pipe 243a sequentially from an upstream direction of the first gas supply pipe 243a. Then, a gas containing a first element (the first processing gas) is supplied from the first gas supply source 243b into the process chamber 201 via the MFC 243c, the valve 243d, the first gas supply pipe 243a and the common gas supply pipe 242.

The first processing gas is, for example, a gas containing a silicon (Si) element. Specifically, dichlorosilane ($SiH_2Cl_2$: DCS) gas or tetraethoxysilane ($Si(OC_2H_5)_4$: TEOS) gas is used. In the following description, an example using the TEOS gas will be described.

The downstream end of a first inert gas supply pipe 246a is connected to the downstream side of the valve 243d of the first gas supply pipe 243a. An inert gas supply source 246b, an MFC 246c and a valve 246d are sequentially connected to the first inert gas supply pipe 246a from an upstream direction of the first inert gas supply pipe 246a. Then, an inert gas is supplied from the inert gas supply source 246b to the first gas supply pipe 243a via the MFC 246c and the valve 246d.

The inert gas is, for example, nitrogen ($N_2$) gas. In addition to the $N_2$ gas, a rare gas such as argon (Ar) gas, helium (He) gas, neon (Ne) gas or xenon (Xe) gas may be used as the inert gas.

The first gas supply part (also referred to as a Si-containing gas supply part) 243, which is one of the processing gas supply parts, mainly includes the first gas supply pipe 243a, the MFC 243c and the valve 243d. The first gas supply source 243b may be included in the first gas supply part 243.

The first inert gas supply part mainly includes the first inert gas supply pipe 246a, the MFC 246c and the valve 246d. The inert gas supply source 246b and the first gas supply pipe 243a may be included in the first inert gas supply part. Further, the first inert gas supply part may be included in the first gas supply part 243.

(Second Gas Supply Part)

A second gas supply source 244b, an MFC 244c and a valve 244d are sequentially connected to the second gas supply pipe 244a from an upstream direction of the second gas supply pipe 244a. Then, a gas containing a second element (the second processing gas) is supplied from the second gas supply source 244b into the process chamber 201 via the MFC 244c, the valve 244d, the second gas supply pipe 244a and the common gas supply pipe 242.

The second processing gas contains a second element (for example, oxygen) different from the first element (for example, Si) contained in the first processing gas and is, for example, an oxygen (O)-containing gas. Specifically, oxygen ($O_2$) gas, ozone ($O_3$) gas, water ($H_2O$) gas or hydrogen peroxide ($H_2O_2$) gas is used. In the following description, an example using the $O_2$ gas will be described.

The downstream end of a second inert gas supply pipe 247a is connected to the downstream side of the valve 244d of the second gas supply pipe 244a. An inert gas supply source 247b, an MFC 247c and a valve 247d are sequentially connected to the second inert gas supply pipe 247a from an upstream direction of the second inert gas supply pipe 247a. Then, an inert gas is supplied from the inert gas supply source 247b to the second gas supply pipe 244a via the MFC 247c and the valve 247d.

The inert gas is the same as in the case of the first inert gas supply part.

The second gas supply part (also referred to as an oxygen-containing gas supply part) 244, which is also one of the processing gas supply parts, mainly includes the second gas supply pipe 244a, the MFC 244c and the valve 244d. The second gas supply source 244b may be included in the second gas supply part 244.

The second inert gas supply part mainly includes the second inert gas supply pipe 247a, the MFC 247c and the valve 247d. The inert gas supply source 247b and the second gas supply pipe 244a may be included in the second inert gas supply part. Further, the second inert gas supply part may be included in the second gas supply part 244.

(Third Gas Supply Part)

A third gas supply source 245b, an MFC 245c and a valve 245d are sequentially connected to the third gas supply pipe 245a from an upstream direction of the third gas supply pipe 245a. Then, an inert gas as a purge gas is supplied from the third gas supply source 245b into the process chamber 201 via the MFC 245c, the valve 245d, the third gas supply pipe 245a and the common gas supply pipe 242.

The inert gas is, for example, $N_2$ gas. In addition to the $N_2$ gas, a rare gas such as Ar gas, He gas, Ne gas or Xe gas may be used as the inert gas.

The third gas supply part (also referred to as a purge gas supply part) 245, which is an inert gas supply part, mainly includes the third gas supply pipe 245a, the MFC 245c and the valve 245d. The third gas supply source 245b may be included in the third gas supply part 245.

The flow rate control part (MFC) installed in each of the gas supply parts described above may desirably have high gas flow responsiveness, such as a needle valve or an orifice. For example, when the pulse width of a gas is on the order of milliseconds, the MFC may have no responsiveness. However, the needle valve or the orifice can be combined with a high speed ON/OFF valve to cope with a gas pulse of milliseconds or shorter.

(Exhaust Part)

An exhaust port 221 for exhausting the internal atmosphere of the process chamber 201 is installed in the upper surface of the inner wall of the process chamber 201 (the upper container 202a). An exhaust pipe 224 as a first exhaust pipe is connected to the exhaust port 221. A pressure regulator 227 such as an APC (Auto Pressure Controller) for controlling the interior of the process chamber 201 to a predetermined pressure and a vacuum pump 223 are connected in series to the exhaust pipe 224.

The pressure regulator 227 is configured to adjust the internal pressure of the process chamber 201 under control by the controller 260 which will be described later, when carrying out a process of substrate processing to be described later. More specifically, the pressure regulator 227 is configured so as to adjust the internal pressure of the process chamber 201 by varying the degree of opening of a valve of the pressure regulator 227 according to a process recipe in which procedures and conditions of substrate processing to be described later are written.

The exhaust characteristics at the time of exhausting the atmosphere in the process chamber 201 affect the characteristics of a film formed on the wafer 200 in the process of substrate processing. The term "exhaust characteristics" used herein refers to the characteristics indicating the relationship between the supply flow rate of the third gas (inert gas) and the internal pressure of the process chamber 201 (including the interior of the exhaust pipe 224 communicating to the process chamber 201). Such exhaust characteristics may be varied depending on circumstances such as, for example, before performing the first process of substrate processing, after performing a plurality of processes of substrate processing, after the idling state in which the substrate processing is not performed, and the like. If the exhaust characteristics deviate from the reference characteristics (reference data) from which desired film characteristics are obtained, there is a possibility that the desired film characteristics cannot be obtained in the process of substrate processing.

As for the exhaust characteristics, it is also conceivable to control and adjust the valve opening degree of the pressure regulator 227. However, the process recipe used in the process of substrate processing is unified to be used in common for a plurality of substrate processing apparatuses 100. Therefore, the pressure regulator 227 whose valve opening degree is controlled according to the process recipe has difficulty in coping with pressure adjustment to be performed individually according to the situation of each substrate processing apparatus 100.

Therefore, in the present disclosure, apart from the pressure regulator 227, an exhaust regulating valve 228 as an exhaust regulating part is installed at the front stage or rear stage of the pressure regulator 227 in the exhaust pipe 224. The exhaust regulating valve 228 is configured to adjust the exhaust characteristic at the time of exhausting the internal atmosphere of the process chamber 201 by varying the opening degree of the valve of the exhaust regulating valve 228 according to an exhaust characteristics modification recipe used in an exhaust characteristics adjusting process to be described later, not in the process of substrate processing. That is, the exhaust characteristics can be adjusted by controlling the exhaust regulating valve 228 using the controller 260.

In addition, in order to improve the easiness of determination on such as whether the cause of a change in the exhaust characteristics is, for example, clogging of the exhaust pipe 224 or performance deterioration of the vacuum pump 223, the exhaust regulating valve 228 may be installed directly above the vacuum pump 223. In other words, the exhaust regulating valve 228 may be installed on the vacuum pump 223 side rather than the pressure regulator 227.

In the exhaust pipe 224, for example, a pressure sensor 229 serving as a pressure measuring part for measuring the internal pressure of the exhaust pipe 224 is installed at the front stage of the pressure regulator 227 (that is, on the side close to the process chamber 201). Although the example where the pressure sensor 229 measures the internal pressure of the exhaust pipe 224 is described, the pressure sensor 229 may measure the internal pressure of the process chamber 201. That is, the pressure sensor 229 may measure one of the internal pressure of the process chamber 201 or the internal pressure of the exhaust pipe 224 constituting the exhaust part.

The exhaust part (exhaust line) mainly includes the exhaust port 221, the exhaust pipe 224, the pressure regulator 227 and the exhaust regulating valve 228. The vacuum pump 223 and the pressure sensor 229 may be included in the exhaust part.

(Control Part)

The substrate processing apparatus 100 has a controller 260 as a control part (controller) for controlling the operations of various parts constituting the substrate processing apparatus 100.

Figure 2:
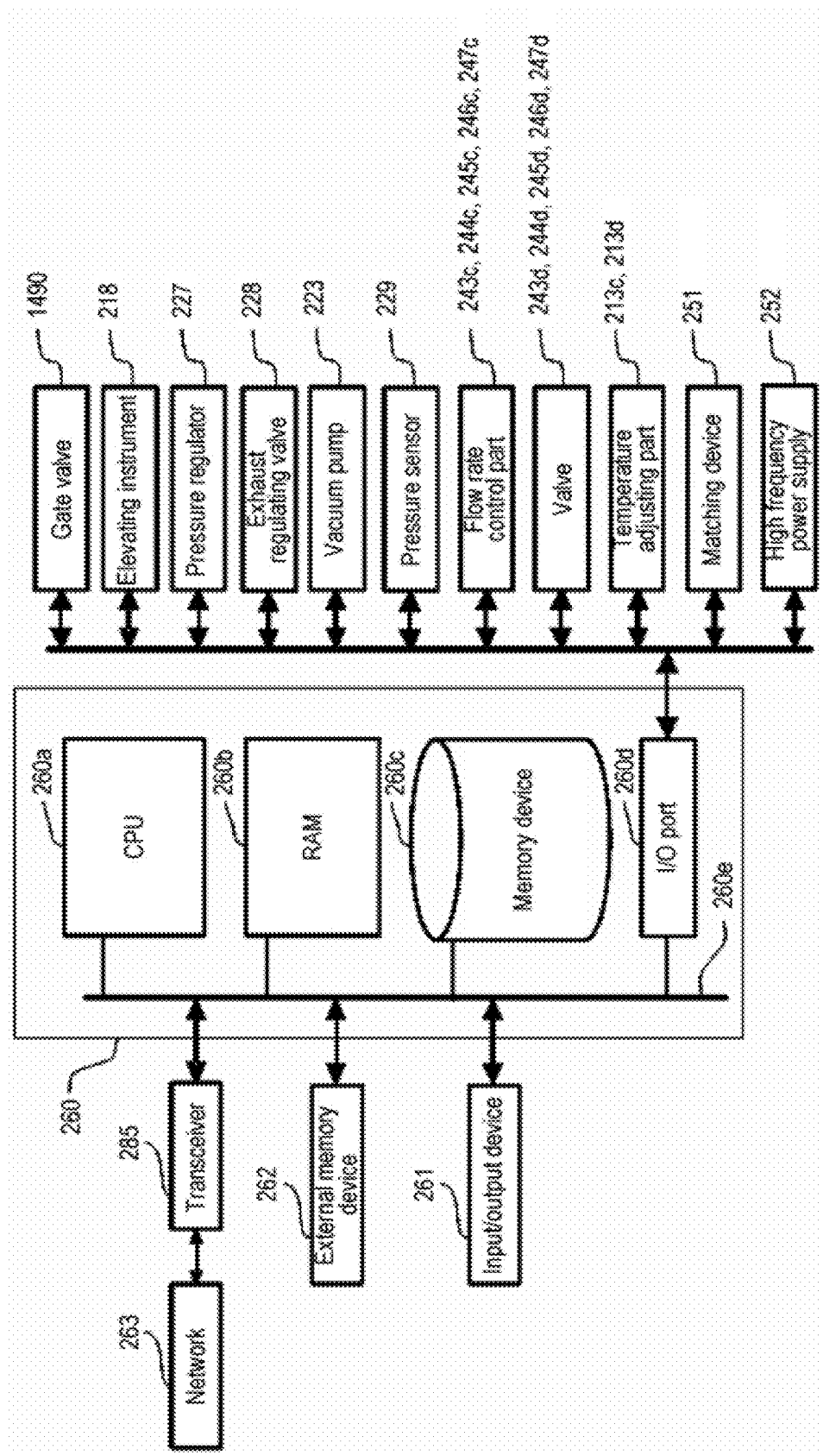
FIG. 2 is a view schematically showing the configuration of a controller according to an embodiment.

As illustrated in FIG. 2, the controller 260 includes a computer including a CPU (Central Processing Unit) 260a, a RAM (Random Access Memory) 260b, a memory device 260c and an I/O port 260d. The RAM 260b, the memory device 260c and the I/O port 260d are configured to exchange data with the CPU 260a via an internal bus 260e. An input/output device 261 including a touch panel or the like, and an external memory device 262 may be connected to the controller 260. In the present disclosure, the term "connection" includes not only the meaning that parts are connected by a physical cable (signal line) but also the meaning that signals (electronic data) of the parts can be transmitted/received directly or indirectly.

The memory device 260c includes, for example, a flash memory, a hard disk drive (HDD) or the like. A control program for controlling the operation of the substrate processing apparatus 100, a process recipe in which procedures and conditions of substrate processing to be described later are written, and an exhaust characteristics modifying recipe in which procedures and conditions of exhaust characteristics adjustment to be described later, arithmetic data and processing data which are generated in various processes, and the like are written are readably stored in the memory device 260c. The process recipe functions as a program for causing the controller 260 to execute each procedure in the process of substrate processing to be described later, to obtain a predetermined result. The exhaust characteristics modifying recipe functions as a program for causing the controller 260 to execute each procedure in the exhaust characteristics adjusting process to be described later, to obtain a predetermined result. Hereinafter, the process recipe, the exhaust characteristics modifying recipe and the control program will be generally and simply referred to as a "program" or a "recipe." When the term "program" is used herein, it may indicate a case of including only the recipe, a case of including only the control program, or a case of including both the recipe and the control program. In addition, the RAM 260b is configured as a memory area (work area) in which a program, arithmetic data, processing data and the like read by the CPU 260a are temporarily stored.

The I/O port 260d is connected to the gate valve 1490, the elevating instrument 218, the pressure regulator 227, the exhaust regulating valve 228, the vacuum pump 223, the pressure sensor 229, the MFCs 243c, 244c, 245c, 246c and 247c, the valves 243d, 244d, 246d and 247d, the temperature adjustment parts 213c and 213d, the matching device 251, the high frequency power supply 252, and the like.

The CPU 260a serving as a computing part is configured to read and execute the control program from the memory device 260c. The CPU 260a is also configured to read the recipe from the memory device 260c according to an input of an operation command from the input/output device 261. In addition, the CPU 260a is configured to calculate arithmetic data by comparing a set value input from a transceiver 285 and the recipe and control data stored in the memory device 260c. Further, the CPU 260a is configured to execute a process of determining the processing data (recipe) or the like from the arithmetic data. The CPU 260a is configured to control the opening/closing operation of the gate valve 1490, the elevating operation of the elevating instrument 218, the supply of power of the temperature adjustment parts 213c and 213d, the power matching operation of the matching device 251, the on/off control of the high frequency power supply 252, the operation control of the MFCs 243c, 244c, 245c, 246c and 247c, the on/off control of the gas of the valves 243d, 244d, 245d, 246d, and 247d, the valve opening degree adjustment of the pressure regulator 227, the valve opening degree adjustment of the exhaust regulating valve 228, the on/off control of the vacuum pump, and the like, according to contents of the read recipe The controller 260 is not limited to a case where it is configured as a dedicated computer, but may be configured as a general-purpose computer. For example, the controller 260 may be configured by installing, on the general-purpose computer, the aforementioned program stored in an external memory device 262 (for example, a magnetic tape, a magnetic disk such as a flexible disk or a hard disk, an optical disk such as a CD or DVD, a magneto-optical disk such as an MO, a semiconductor memory such as a USB memory or memory card). However, the way for supplying the program to the computer is not limited to the case where it is supplied via the external memory device 262. For example, a communication part such as a network 263 (the Internet or a dedicated line) may be used to supply the program without going through the external memory device 262. The memory device 260c or the external memory device 262 includes a non-transitory computer-readable recording medium. Hereinafter, these memory devices will be generally and simply referred to as a "recording medium." When the term "recording medium" is used herein, it may indicate a case of including only the memory device 260c, a case of including only the external memory device 262, or a case of including both the memory device 260c and the external memory device 262.

(2) Configuration of Substrate Processing System

Next, a schematic configuration of a substrate processing system including the substrate processing apparatus 100 having the above-described configuration will be described.

(Configuration of the Entire System)

Figure 3:
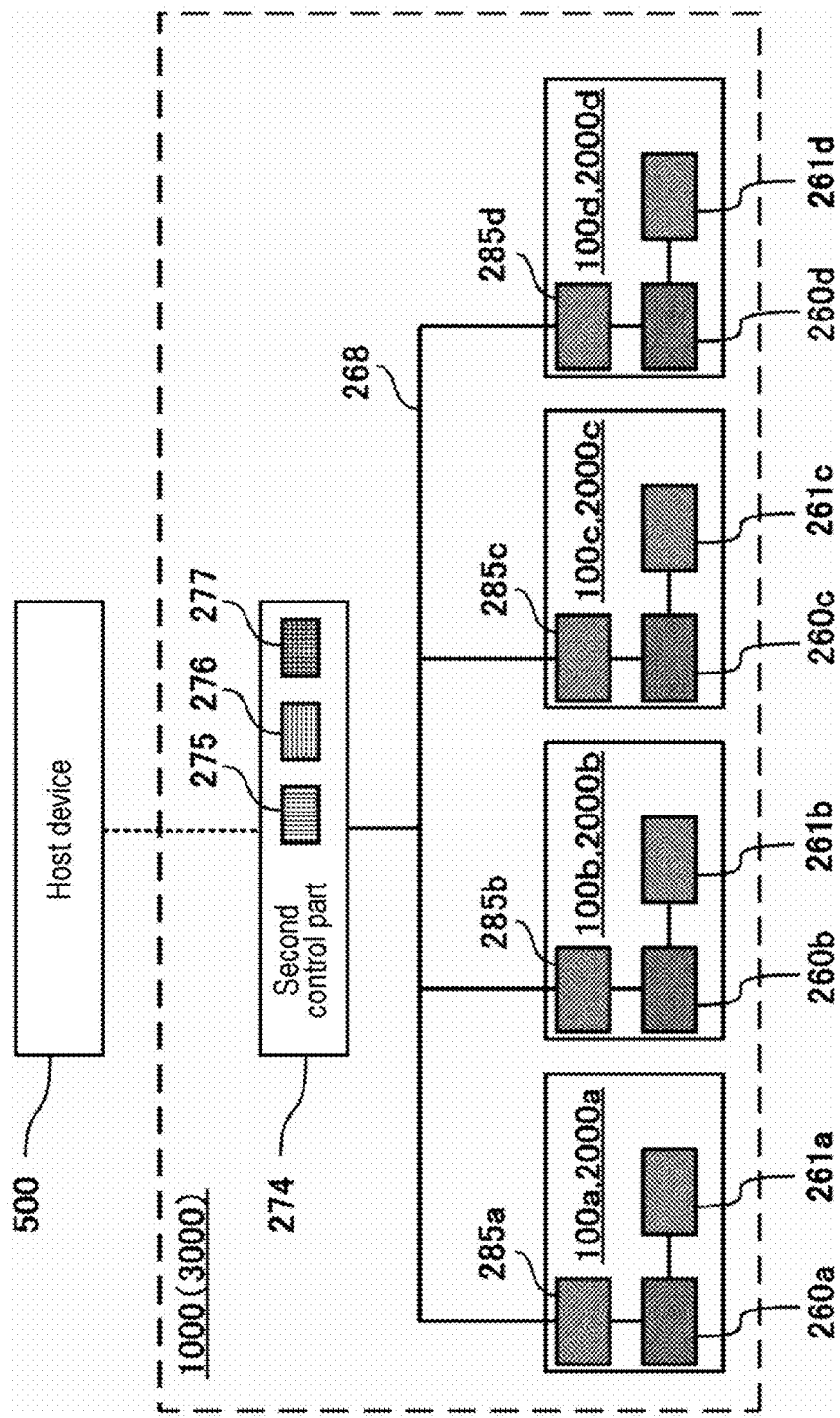
FIG. 3 is a view schematically showing the configuration of a substrate processing system according to an embodiment.

As illustrated in FIG. 3, a substrate processing system 1000 includes a plurality of substrate processing apparatuses 100 (100a, 100b, 100c and 100d), a second control part 274 and a network 268 that connects the substrate processing apparatuses 100 and the second control part 274. A host device 500 may be included in the substrate processing system 1000. Here, the second control part 274 is, for example, a group management controller that manages the plurality of substrate processing apparatuses 100. The host device 500 is, for example, a host computer.

In such a substrate processing system 1000, each of the substrate processing apparatuses 100a, 100b, 100c and 100d includes a controller 260 (260a, 260b, 260c and 260d) as a control part for acquiring various data, an input/output device 270 (270a, 270b, 270c and 270d) as a display part for displaying various data, and a transceiver 285 (285a, 285b, 285c and 285d) for exchanging various data with the second control part 274.

On the other hand, the second control part 274 includes a first computing part 275, a first memory part 276 and a first transceiver 277. The first transceiver 277 exchanges data with the substrate processing apparatuses 100 and the second control part 274. The first memory part 276 records data, data calculated by the first computing part 275, data transmitted from the host device 500, any data input by a user, a database of these data, and the like. The first computing part 275 is configured to perform an arithmetic process based on at least one of the above data.

The substrate processing system is not limited to the substrate processing system 1000 including a plurality of substrate processing apparatuses 100. For example, the substrate processing system may be a substrate processing system 3000 including a plurality of cluster-type substrate processing apparatuses 2000 (2000a, 2000b, 2000c and 2000d) to be described below.

(Configuration of Cluster-Type Substrate Processing Apparatus)

Hereinafter, a cluster-type substrate processing apparatus 2000 constituting the substrate processing system 3000 will be described. The cluster-type substrate processing apparatus 2000 includes a plurality of substrate processing apparatuses 100 described above.

Figure 4:
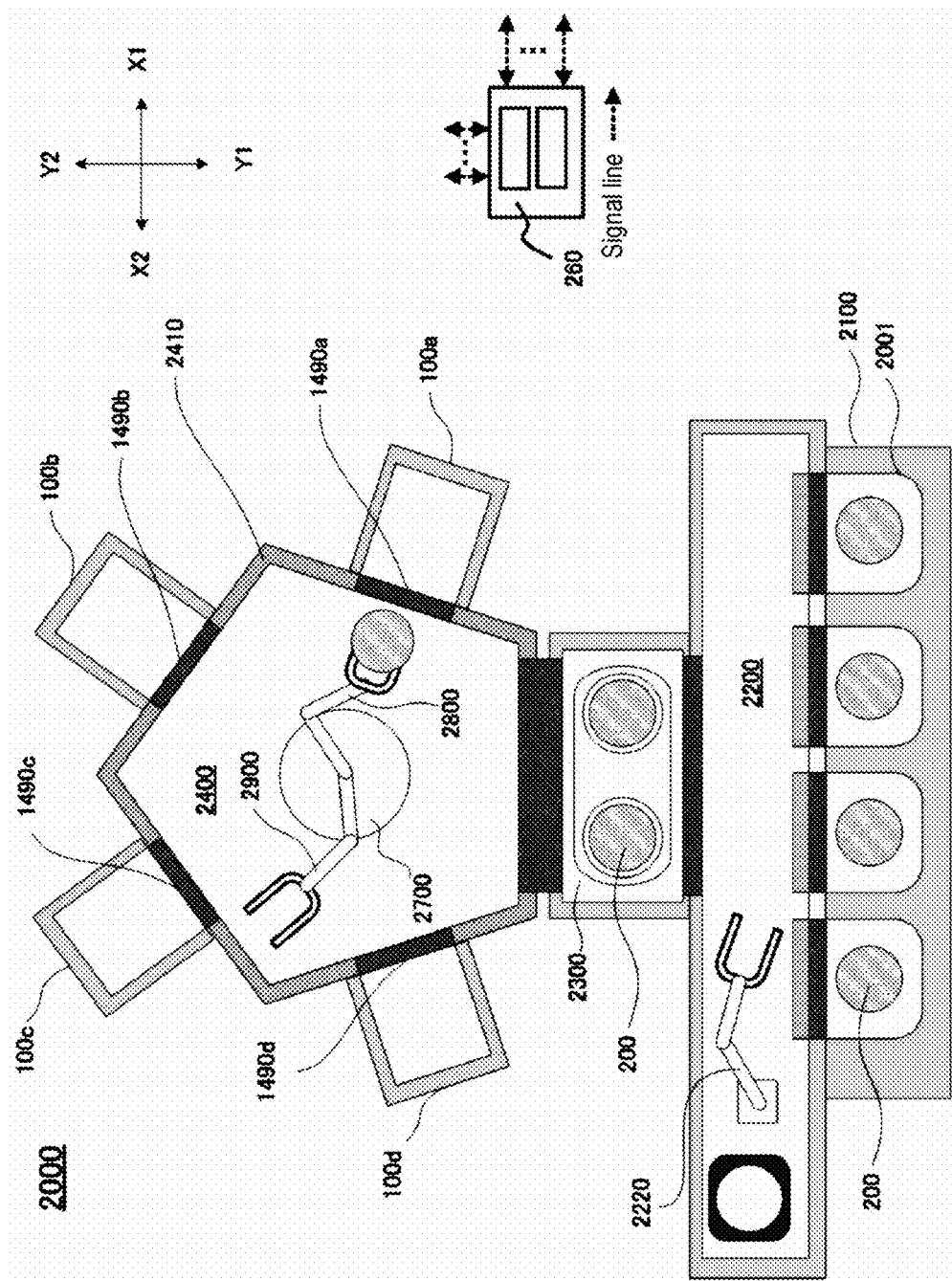
FIG. 4 is a view schematically showing the configuration of a cluster-type substrate processing apparatus according to another embodiment.

As illustrated in FIG. 4, the cluster-type substrate processing apparatus 2000 for processing a wafer 200 includes an IO stage 2100, an atmospheric transfer chamber 2200, a load lock (L/L) 2300, a vacuum transfer chamber 2400 and a plurality of substrate processing apparatuses 100 (100a, 100b, 100c and 100d). In the figure, it is assumed that the right side is a X1 direction, the left side is a X2 direction, the front side is a Y1 direction and the rear side is a Y2 direction.

The IO stage (load port) 2100 is installed in front of the cluster-type substrate processing apparatus 2000. A plurality of pods 2001 is mounted on the IO stage 2100. The pod 2001 is used as a carrier for transporting wafers 200 and is configured such that a plurality of unprocessed wafers 200 or processed wafers 200 is stored horizontally.

The IO stage 2100 is adjacent to the atmospheric transfer chamber 2200. An atmospheric transfer robot 2220 as a first transfer robot for transferring the wafers 200 is installed in the atmospheric transfer chamber 2200. A load lock chamber 2300 is connected to the atmospheric transfer chamber 2200 on a side different from the IO stage 2100.

The load lock chamber 2300 is structured to withstand a negative pressure since the internal pressure thereof is varied according to the pressure of the atmospheric transfer chamber 2200 and the pressure of the vacuum transfer chamber 2400 to be described later. The vacuum transfer chamber (transfer module: TM) 2400 is connected to the load lock chamber 2300 on a side different from the atmospheric transfer chamber 2200.

The TM 2400 functions as a transfer chamber serving as a transfer space in which the wafer 200 is transferred under a negative pressure. A housing 2410 constituting the TM 2400 is formed as a pentagon in a plane view. A plurality of substrate processing apparatuses 100 for processing the wafer 200 (for example, four substrate processing apparatuses) are respectively connected to sides excluding a side to which the load lock chamber 2300 is connected, among the sides of the pentagon. A vacuum transfer robot 2700 as a second transfer robot for transferring the wafer 200 under a negative pressure is installed substantially at the center of the TM 2400. Although it is illustrated here that the vacuum transfer chamber 2400 has a pentagon shape, the vacuum transfer chamber 2400 may be of a polygonal shape such as a quadrangle or a hexagon.

The vacuum transfer robot 2700 installed in the TM 2400 has two arms 2800 and 2900 that can operate independently. The vacuum transfer robot 2700 is controlled by the controller 260 described above.

A gate valve (GV) 1490 is installed between the TM 2400 and each substrate processing apparatus 100. Specifically, a gate valve 1490a is installed between the substrate processing apparatus 100a and the TM 2400, and a GV 1490b is installed between the substrate processing apparatus 100b and the TM 2400. A GV 1490c is installed between the substrate processing apparatus 100c and the TM 2400, and a GV 1490d is installed between the substrate processing apparatus 100d and the TM 2400. When each GV 1490 is opened, the vacuum transfer robot 2700 in the TM 2400 can take in and out the wafer 200 via the substrate loading/unloading port 1480 installed in each substrate processing apparatus 100.

(3) Process of Substrate Processing

Next, substrate processing executed by the substrate processing apparatus 100 having the above-described configuration will be described. Here, as an example of substrate processing, a film forming process, which is one step of a process of manufacturing a semiconductor device, is described. In the following description, the operation of each part is controlled by the controller 260.

(Substrate Loading Step: S201)

Figure 5:
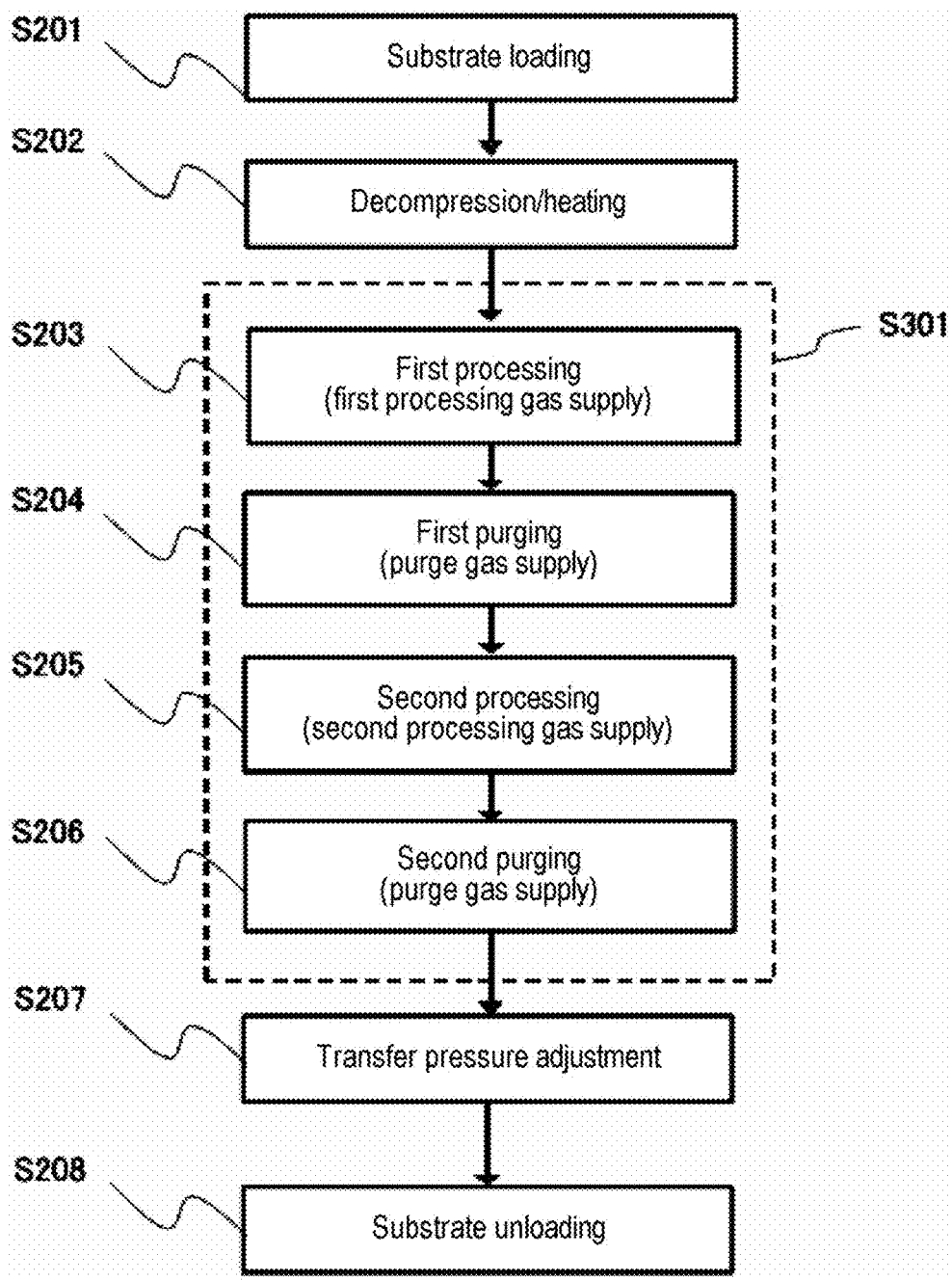
FIG. 5 is a flowchart showing an example of a sequence for a process of substrate processing according to an embodiment.

In the film forming process, as illustrated in FIG. 5, first, a wafer 200 is loaded into the process chamber 201. Specifically, the substrate support 210 is lowered by the elevating instrument 218 such that the lift pins 207 protrude from the through-holes 214 toward the upper surface side of the substrate support 210. After adjusting the process chamber 201 and the transfer chamber 203 to a predetermined pressure, the gate valve 1490 is opened and the wafer 200 is mounted on the lift pins 207 from the opening of the gate valve 1490. After mounting the wafer 200 on the lift pins 207, the gate valve 1490 is closed and the substrate support 210 is raised to a predetermined position by the elevating instrument 218, so that the wafer 200 is mounted on the substrate mounting table 212 and is positioned at a processing position (wafer processing position) in the process chamber 201.

(Decompression/Heating Step: S202)

Subsequently, the interior of the process chamber 201 is exhausted via the exhaust pipe 224 so that the interior of the process chamber 201 has a predetermined pressure (degree of vacuum). At this time, based on a pressure value (pressure data) measured by the pressure sensor 229, the opening degree of the valve of the pressure regulator 227 is feedback-controlled. Further, based on a temperature value detected by the temperature sensor (not shown), the amount of electric current to the heaters 213a and 213b is feedback-controlled so that the interior of the process chamber 201 has a predetermined temperature. Specifically, the substrate support 210 is heated in advance by the heaters 213a and 213b and is left alone for a certain period of time after a change in temperature of the wafer 200 or the substrate support 210 disappears. Meanwhile, when moisture or a gas ejected from a member is left in the process chamber 201, it may be removed by vacuum exhaust or purging by supply of an $N_2$ gas. Thus, preparation before the film forming process is completed. When exhausting the interior of the process chamber 201 to the predetermined pressure, vacuum exhaust may be performed once until the interior of the process chamber 201 reaches an intended degree of vacuum.

The temperatures of the heaters 213a and 213b at this time are set to a constant temperature within a range of 100 to 600 degrees C., specifically 100 to 500 degrees C., more specifically 250 to 450 degrees C. In addition, the temperatures of the heaters 213a and 213b are adjusted (maintained) so that the temperature of the wafer 200 during substrate processing is constant.

(Film Forming Step: S301)

Then, when the internal atmosphere of the process chamber 201 is stabilized, the process proceeds to a film forming step (S301). Here, as the film forming step, an example of forming a silicon oxide ($SiO_2$) film on the surface of the wafer 200 will be described.

Figure 6:
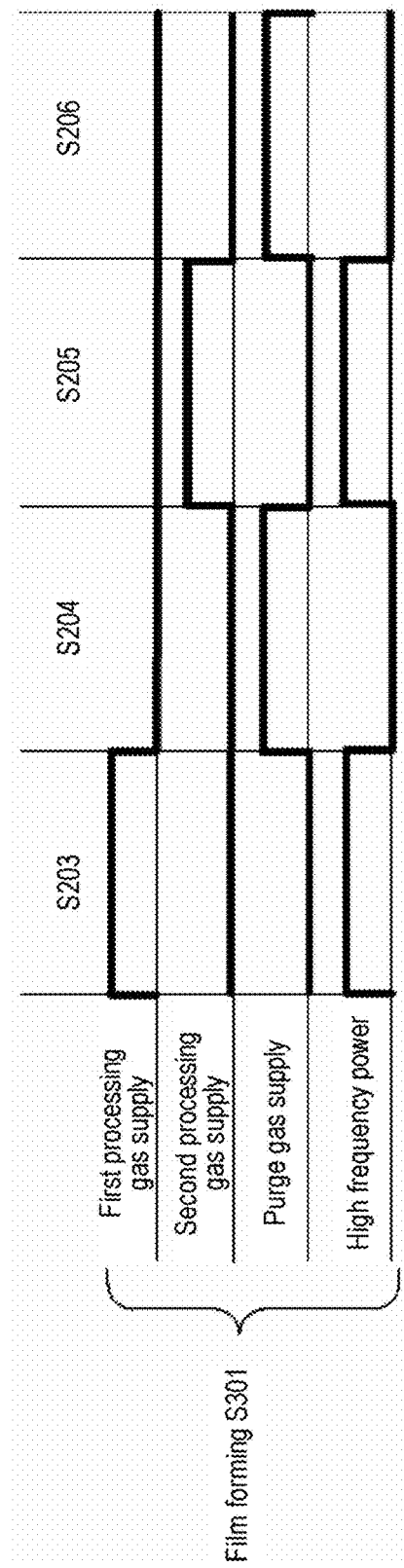
FIG. 6 is a chart showing an example of a sequence for a process of film forming in a process of substrate processing, according to an embodiment.

As illustrated in FIGS. 5 and 6, the film forming step (S301) includes a first gas supplying step (S203), a first purging step (S204), a second gas supplying step (S205) and a second purging step (S206) which are sequentially performed.

(First Gas Supplying Step: S203)

In the first gas supplying step (S203), the TEOS gas as a first processing gas is supplied from the first gas supply part 243 into the process chamber 201. Specifically, the valve 243d is opened and the TEOS gas is supplied from the first gas supply source 243b while its flow rate is adjusted with the MFC 243c. The TEOS gas with the adjusted flow rate passes through the buffer chamber 234 and reaches the process chamber 201 in a decompressed state from the dispersion plate 234b. At this time, the exhaust of the interior of the process chamber 201 by the exhaust part is continued to adjust the internal pressure of the process chamber 201 to a predetermined pressure range (first pressure). As a result, the TEOS gas is supplied into the process chamber 201 at a predetermined pressure (first pressure: for example, 10 Pa to 1,000 Pa). As the TEOS gas is supplied, a silicon-containing layer is formed on the wafer 200 in the process chamber 201. Here, the silicon-containing layer is a layer containing silicon (Si) or containing silicon and carbon (C).

(First Purging Step: S204)

After the silicon-containing layer is formed on the wafer 200 in the first gas supplying step (S203), the valve 243d is closed to end the supply of the TEOS gas. Then, the first purging step (S204) is performed to exhaust TEOS gas remaining in the process chamber 201 and TEOS gas remaining in the buffer chamber 234 from the exhaust part.

In the first purging step (S204), in addition to simply exhausting (evacuating) the residual gas to discharge the residual gas from the interior of the process chamber 201, a discharging process of discharging the residual gas may be performed by supplying an inert gas from the third gas supply part 245. In this case, the valve 245d is opened to adjust the flow rate of the inert gas with the MFC 245c. The evacuation and the supply of inert gas may be performed in combination. The evacuation and the supply of inert gas may be alternately performed. Then, after a predetermined time has elapsed, the valve 245d is closed to end the supply of inert gas. The supply of inert gas may be continued with the valve 245d opened.

The temperatures of the heaters 213a and 213b at this time are set to the same temperature as when the TEOS gas is supplied onto the wafer 200. The supply flow rate of $N_2$ gas as a purge gas supplied from the third gas supply part 245 which is the inert gas supply system is set to a flow rate within a range of, for example, 100 to 20,000 sccm. In addition to the $N_2$ gas, a rare gas such as Ar gas, He gas, Ne gas or Xe gas may be used as the purge gas.

(Second Gas Supplying Step: S205)

After the first purging step (S204), the second gas supplying step (S205) is performed. In the second gas supplying step (S205), oxygen ($O_2$) gas as a second processing gas is supplied from the second gas supply part 244 into the process chamber 201. More specifically, the $O_2$ gas is supplied from the second gas supply source 244b into the process chamber 201 via the buffer chamber 234 and the dispersion plate 234b while the valve 244d is opened to adjust its flow rate with the MFC 244c. At this time, the MFC 244c is adjusted so that the flow rate of $O_2$ gas becomes a predetermined flow rate. The supply flow rate of Oz gas is, for example, 100 sccm or more and 10,000 sccm or smaller.

Here, the high frequency power is supplied from the high frequency power supply 252 via the matching device 251. As a result, the $O_2$ gas passes through the dispersion plate 234b so that plasma of $O_2$ gas (active species of $O_2$ gas) is generated in the process chamber 201. When the activated $O_2$ gas is supplied onto the silicon-containing layer on the wafer 200, the silicon-containing layer is modified to form a silicon oxide layer containing a silicon element and an oxygen element.

At this time, if the exhaust characteristics at the time of evacuating the interior of the process chamber 201 deviates from the reference characteristics (reference data), the amount, concentration and the like of the active species generated here may change so as not to perform desired processing. That is, the exhaust characteristics should be maintained at a state where the exhaust characteristics do not deviate greatly from the reference characteristics.

Further, the silicon oxide layer on the wafer 200 is formed to have a predetermined thickness, a predetermined distribution and a penetration depth of predetermined oxygen components in the silicon-containing layer depending on the internal pressure of the process chamber 201, the flow rate of the $O_2$ gas, the temperature of the wafer 200, the power of the high frequency power supply 252, and the like. Among them, the internal pressure of the process chamber 201 and the flow rate of the $O_2$ gas have a great influence on the formation of the silicon oxide layer. On the other hand, the internal pressure of the process chamber 201 and the flow rate of the $O_2$ gas may be influenced by the exhaust characteristics at the time of evacuating the interior of the process chamber 201. From this, it is necessary for the exhaust characteristics to maintain a state where the exhaust characteristics do not deviate greatly from the reference characteristics.

Therefore, as will be described in detail later, the exhaust characteristics at the time of evacuating the interior of the process chamber 201 is adjusted so as not to deviate from the reference characteristics by performing the exhaust characteristics adjusting step at a predetermined timing.

After a predetermined time has elapsed since the start of the second gas supplying step (S205) as described above, when the silicon oxide layer is formed on the wafer 200, the valve 244d is closed to end the supply of the $O_2$ gas.

Although it is illustrated in FIG. 6 that the supply of the high frequency power is started simultaneously with the supply of the $O_2$ gas as the second processing gas, the high frequency power may be supplied before the supply of the $O_2$ gas is started. Further, the supply of the high frequency power may be continued from the first gas supplying process (S203) until a determination process to be described later ends, to generate plasma depending on whether or not the $O_2$ gas is supplied.

(Second Purging Step: S206)

After the silicon oxide layer is formed on the wafer 200 in the second gas supplying step (S205), the second purging step (S206) is performed by the same procedure as in the first purging step (S204). Specifically, the second purging step (S206) is performed by exhausting an $O_2$ gas and by-products remaining in the process chamber 201 and an $O_2$ gas remaining in the buffer chamber 234 from the exhaust part. At this time, the buffer chamber 234 and the process chamber 201 may be purged by supplying an inert gas from the third gas supply part 245.

(Determination Step)

After completion of the second purging step (S206), the controller 260 determines whether or not a predetermined cycle number n has been executed for each of the above steps S203 to S206 constituting the film forming step (S301). A silicon oxide film ($SiO_2$ film) having a predetermined film thickness can be formed on the wafer 200 by repeating, at least once, one cycle including each of the above steps S203 to S206. The above cycle may be repeated a plurality of times.

When it is determined that the above cycle is not performed by the predetermined number of times n, each of the steps S203 to S206 is repeated. On the other hand, when the above cycle is performed by the predetermined number of times n, the film forming step S301 ends. As a result, a $SiO_2$ film having a predetermined film thickness is formed on the wafer 200.

(Transfer Pressure Adjusting Step: S207)

After completion of the film forming step S301, a transfer pressure adjusting step S207 is performed. In the transfer pressure adjusting step S207, the interiors of the process chamber 201 and the transfer chamber 203 are evacuated to a predetermined pressure (degree of vacuum). The lift pins 207 may be held so as to cool the wafer 200 to a predetermined temperature during, before or after the transfer pressure adjusting step S207.

(Substrate Unloading Step: S208)

After the interiors of the process chamber 201 and the transfer chamber 203 reach the predetermined pressure in the transfer pressure adjusting step S207, the gate valve 1490 is opened to unload the wafer 200 into the vacuum transfer chamber 2400 via the substrate loading/unloading port 1480.

Through the series of steps described above, the process of substrate processing for the wafer 200 is performed.

(4) Exhaust Characteristics Adjusting Process

Next, the exhaust gas characteristic adjusting process executed by the substrate processing apparatus 100 having the above-described configuration will be described.

As described above, in the process of substrate processing executed by the substrate processing apparatus 100, the exhaust characteristics at the time of evacuating the interior of the process chamber 201 affects the characteristics of the film formed on the wafer 200.

Figure 7:
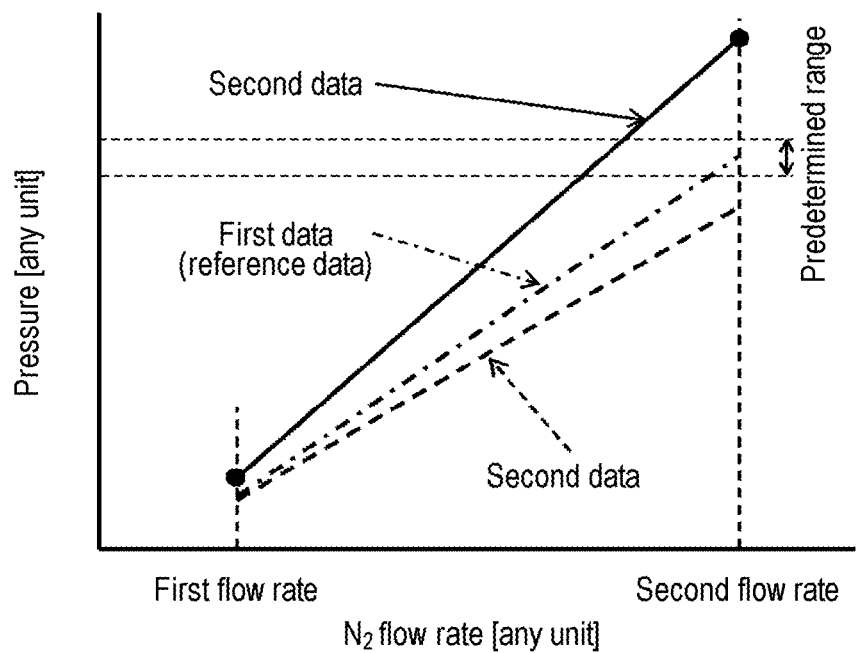
FIG. 7 is an explanatory view showing an example of exhaust characteristics in the substrate processing apparatus according to an embodiment.

The exhaust characteristics referred to here is one of the characteristics of the substrate processing apparatus 100 at the time of exhausting the internal atmosphere of the process chamber 201. Specifically, as illustrated in FIG. 7, the exhaust characteristics are the characteristics indicating the relationship between the supply flow rate of the third gas (inert gas) into the process chamber 201 and the internal pressure of the process chamber 201 (including the interior of the exhaust pipe 224 in communication with the process chamber 201).

Such exhaust characteristics may be varied, for example, due to the influence of clogging of the exhaust pipe 224 constituting the exhaust part (exhaust line), the operation state of the vacuum pump 223 (the presence or absence of performance deterioration), and the like. In addition, such exhaust characteristics may be varied depending on the operation situations of the substrate processing apparatus 100 such as, for example, before performing the first process of substrate processing, after performing a plurality of processes of substrate processing, after the idling state in which the substrate processing is not performed, and the like.

On the other hand, as for the exhaust characteristics, there are the reference characteristics (reference data) serving as a reference for obtaining desired film characteristics in the process of substrate processing.

Therefore, in order to form a film with the desired film characteristics on the wafer 200 in the process of substrate processing, the exhaust characteristics should be adjusted such that the exhaust characteristics do not deviate from the reference characteristics.

From this fact, in the present disclosure, by using the exhaust regulating valve 228 installed separately from the pressure regulator 227 to perform the exhaust characteristics adjusting process at a predetermined timing, it is possible to prevent the exhaust characteristics from deviating from the reference characteristics.

The predetermined timing at which the exhaust characteristics adjusting process is performed may be at least one of, for example, when the substrate processing apparatus 100 is operated; before or after maintenance of the substrate processing apparatus 100; when the total film forming time (the number of times of film forming processes) in the substrate processing apparatus 100 exceeds a predetermined time (number of times); after processing wafers 200 of a predetermined lot number; and after the integrated flow rate of the MFC 243c of the first gas supply part 243 exceeds a predetermined flow rate, etc. Preferably, the predetermined timing is when the total film forming time (the number of times of film forming processes) in the substrate processing apparatus 100 exceeds a predetermined time (number of times). By performing the exhaust characteristics adjusting process at such a timing, variations in characteristics of each of a plurality of wafers 200 being continuously processed can be reduced.

Hereinafter, the procedure of the exhaust characteristics adjusting process will be described in detail. In the following description, the operation of each part is controlled by the controller 260.

(First Data Acquiring Step: S501)

Figure 8:
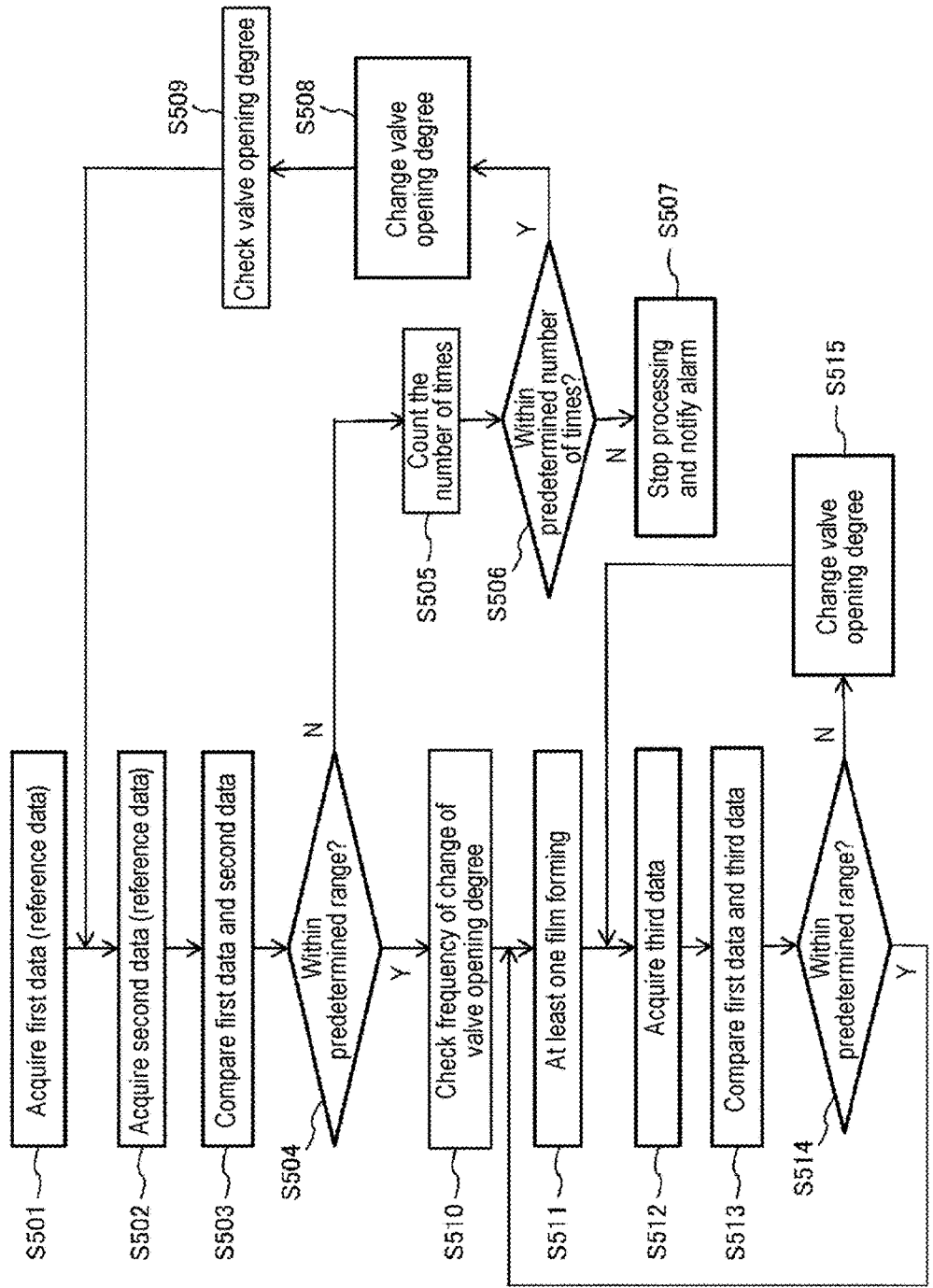
FIG. 8 is a flowchart showing an example of a sequence of an exhaust characteristic adjusting process according to an embodiment.

In the exhaust gas characteristics adjusting step, as illustrated in FIG. 8, first, first data as reference data on the exhaust characteristics is acquired. Specifically, the first data stored in the memory device 260c of the controller 260 is read into the RAM 260b.

The first data is not limited to reading from the memory device 260c but may be acquired from the host device 500 such as a host computer through the transceiver 285 or may be acquired from another substrate processing apparatus 100 in the substrate processing system 1000. Here, the other substrate processing apparatus 100 refers to one having good characteristics of a film formed on the wafer 200 (that is, an apparatus capable of obtaining the desired film characteristics), among the plurality of substrate processing apparatuses 100a, 100b, 100c and 100d on which the same process of substrate processing (process recipe) is executed. Further, the other substrate processing apparatus 100 may be any one of the plurality of cluster-type substrate processing apparatuses 2000a, 2000b, 2000c and 2000d.

The first data obtained in this manner may be, for example, one indicated by a one-dot chain line in FIG. 7.

(Second Data Acquiring Step: S502)

Subsequently, in the substrate processing apparatus 100 that performs the exhaust characteristics adjusting process, second data that is actual measurement data on the exhaust characteristics is acquired. More specifically, in a state in which the valve opening degree of the pressure regulator 227 and the valve opening degrees of the exhaust regulating valve 228 are set to a predetermined value, the third gas (inert gas) is supplied from the third gas supply part 245 into the process chamber 201, the flow rate of the inert gas is changed from a first flow rate (minimum flow rate) to a second flow rate (maximum flow rate), and a pressure value (pressure data) at that time is measured by the pressure sensor 229. Then, based on the measurement result of the pressure sensor 229, the second data which is the actual measurement data on the exhaust characteristics is obtained.

Here, the first flow rate is equal to the flow rate of an inert gas (carrier gas) supplied between the end of the supply of the first gas and the supply of the purge gas, among the first gas supplying step S203 and the first purging step S204. In addition, the first flow rate may be equal to the flow rate of an inert gas (carrier gas) supplied between the end of the supply of the second gas and the supply of the purge gas, among the second gas supplying step S205 and the second purging step S206.

The second flow rate is equal to the flow rate of the third gas (inert gas) supplied in the first purging step S204 and the second purging step S206. Further, the second flow rate may be equal to the flow rate of the third gas supplied at the time of returning the interior of the process chamber 201 to a predetermined pressure in the transfer pressure adjusting step S207. The flow rate in the purging step (particularly, the first purging step) that affects the characteristics of the film formed on the wafer 200 may be used.

The second data obtained in this manner may be one indicated by a solid line in FIG. 7. The gradient of the second data (actual measurement data) varies due to clogging of the exhaust pipe 224 or the like. Particularly, since a pressure difference becomes remarkable at a place where the flow rate is large, the gradient of the second data tends to become steep. However, the gradient of the second data is not necessarily steeper than that of the first data. For example, the second data acquired when the apparatus is operated may be as one indicated by a broken line in FIG. 7.

(Data Computing Step: S503)

After acquiring the first data and the second data, the second data is compared with the first data to obtain a difference between the first data and the second data as difference data. More specifically, first, since both the first data and the second data have linearity (see FIG. 7), data indicating the gradient of each of the first data and the second data (that is, a ratio of change in pressure to change in flow rate) is obtained by computation. The gradient data on the first data may be computed when acquiring the first data. After obtaining the gradient data of the first data and the second data, a difference value between the gradient data is calculated and is set as the difference data.

The difference data does not necessarily need to be a difference value between the gradient data but may be one other than the difference value. For example, the difference data may be a difference value between a pressure value of the first data and a pressure value of the second data at the second flow rate (maximum flow rate).

(Determination Step: S504)

After obtaining the difference data between the first data and the second data, it is determined whether or not the difference data is within a predetermined range. Specifically, for example, when the difference data is a difference value between the gradient data, it is determined whether or not the difference value as the difference data is within a predetermined range (for example, within ±2.5 [any unit]). Further, for example, if the difference data is a pressure difference value at the maximum flow rate, it is determined whether or not the difference value as the difference data is within a predetermined range (for example, within ±10 [any unit]).

Hereinafter, a determination step S504 will be described in more detail by way of a specific example.

Figure 9:
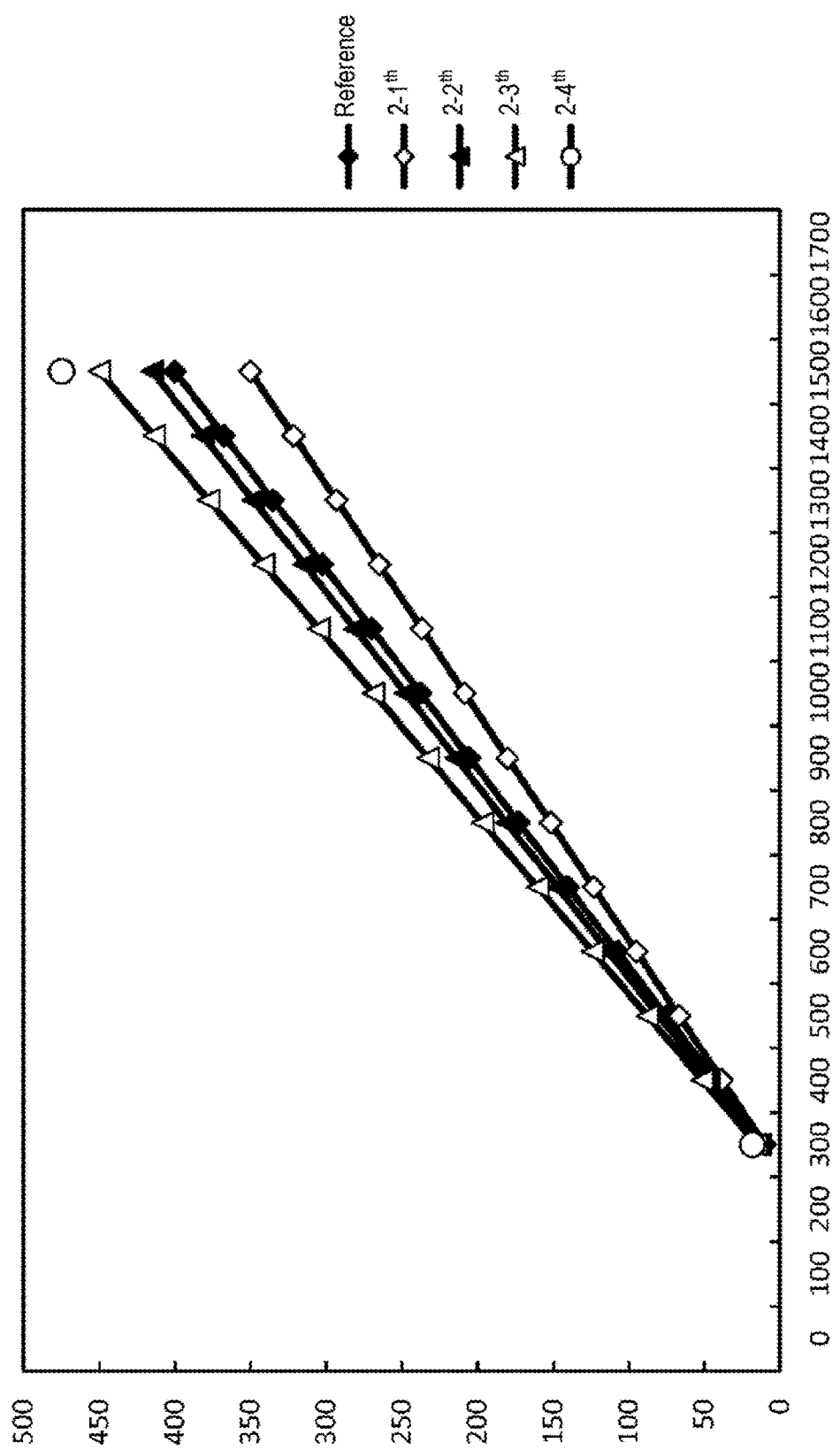
FIG. 9 is an explanatory view showing a specific example of first data and second data according to an embodiment.

Consider, for example, a case where the second data as illustrated in FIG. 9 is acquired. In this case, the second data acquisition is performed four times from 2-1 to 2-4 and the first data is shown as the reference data.

In such a case of acquiring the second data, for example, if the difference value between the gradient data is to be the difference data, as illustrated in FIG. 10, gradient values (for example, 28.35, 33.5, 36.25, 38.1 [any unit]) for the second data are obtained and compared with a gradient value (for example, 32.5 [any unit]) for the first data to determine whether or not the difference data therebetween is within a predetermined range (for example, within ±2.5 [any unit]).

Further, for example, if the pressure difference value at the maximum flow rate is set as the difference data, as illustrated in FIG. 11, pressure values (for example, 350, 415, 450 and 475 [any unit]) for the second data are obtained and compared with a pressure value (for example, 400 [any unit]) for the first data to determine whether or not the difference data therebetween is within a predetermined range (for example, within ±10 [any unit]).

When it is determined that the difference data is not within the predetermined range (NO in S504), a valve opening degree changing step S508 to be described later is performed. On the other hand, when it is determined that the difference data is within the predetermined range (YES in S504), a series of substrate processing steps S201 to S208 including the film forming step S301 can be performed.

(Alarming Step: S504 to S507)

When it is determined at the determination step S504 that the difference data is not within the predetermined range (NO in S504), the count number of a counter that counts the number of times thereof is incremented (S505) and it is determined whether or not the count number is within a predetermined number of times (for example, three times) (S506). The count number is reset when the process escapes from a routine for repeating each step to be described later.

When it is determined that the count number exceeds the predetermined number of times (NO in S506), it is determined that an abnormality has occurred in the exhaust part, the process under execution in the substrate processing apparatus 100 is stopped, maintenance data indicating that maintenance for the exhaust part is required is outputted, and an alarm alerts an apparatus operator (S507). The maintenance data is data for notifying necessity (start request) of maintenance for the exhaust part. This makes it possible to prevent reduction in a throughput of a semiconductor device manufacturing process due to repeated execution of a valve opening changing step S508 by a plurality of numbers of times. The alarm notification may be performed by outputting the maintenance data to the input/output device 261 and causing the input/output device 261 to display an alarm screen, or may be performed by outputting the maintenance data to the host device 500.

(Valve Opening Degree Changing Step: S508 and S509)

When it is determined that the difference data is not within the predetermined range (NO in S504) and it is determined that the count number does not exceed the predetermined number of times (YES in S506), the valve opening changing step S508 is performed. In the valve opening degree changing step S508, the valve opening degree of the exhaust regulating valve 228 is changed so that the second data comes closer to the first data. More specifically, when the gradient data on the second data is larger than the gradient data on the first data, the valve opening degree of the exhaust regulating valve 228 is increased. When the gradient data on the second data is smaller than the gradient data on the first data, the valve opening degree of the exhaust regulating valve 228 is decreased. The amount of change (adjustment amount) of the valve opening degree at this time may depend on the size of the difference data or may be a preset quantitative value. By adjusting the valve opening degree of the exhaust regulating valve 228 thus, the second data can be brought closer to the first data.

After adjusting the valve opening degree of the exhaust regulating valve 228, the adjusted valve opening degree may be checked (S509). When it is checked that the adjusted valve opening degree exceeds a predetermined opening degree (that is, an allowable opening degree), maintenance time data indicating that the maintenance time of the exhaust part is approaching may be output to notify an alarm to the apparatus operator. In this way, it becomes possible to perform the maintenance in accordance with the alarm notification and thereby to promptly and appropriately eliminate the cause of pump performance deterioration and pipe clogging. The alarm notification may be performed in the same manner as in the above-described alarming step S507.

After performing the valve opening degree changing step S508 and checking the valve opening degree at S509 as necessary, the above series of steps are repeated starting from the second data acquiring step S502 (S502 to S509). That is, the above series of steps are repeated until the difference data falls within the predetermined range in the determination step S504 (S502 to S509). As a result, the valve opening degree of the exhaust part of the substrate processing apparatus 100 is adjusted to approach the second data to the first data. With this adjustment, the exhaust characteristics are feedback-controlled so that the exhaust characteristics do not deviate from the reference characteristics.

(Frequency Checking Step: S510)

When it is determined at the determination step S504 that the difference data is within the predetermined range (YES in S504), the series of substrate processing steps S201 to S208 including the film forming step S301 can be performed. However, prior to the start of the substrate processing steps, the frequency of adjustment of the exhaust characteristics by the change in valve opening degree of the exhaust regulating valve 228 may be recorded (S510). Specifically, for example, the number of executions of the valve opening degree changing step S508 with respect to the number of times of the film forming step S301 may be recorded as the frequency of execution of the valve opening changing step S508 (that is, the frequency of adjustment of the exhaust characteristics). In this way, when the frequency of adjustment of the exhaust characteristic is recorded, by checking the adjustment frequency, for example, when the adjustment frequency exceeds the predetermined frequency, the maintenance time data indicating that the maintenance time of the exhaust part is approaching can be output. Therefore, by outputting the maintenance timing data to notify the apparatus operator of an alarm, it is possible to perform the maintenance according to the alarm notification and thereby to promptly and appropriately eliminate the cause of pump performance deterioration and pipe clogging. The alarm notification may be performed in the same manner as in the above-described alarming step S507.

(At Least One Film Forming Step: S511)

Thereafter, since the difference data is within the predetermined range and the exhaust characteristics do not deviate from the reference characteristics, the series of substrate processing steps S201 to S208 including at least one film formation step S301 are performed as necessary.

When the series of substrate processing steps S201 to S208 including the film forming step S301 are performed a predetermined number of times and for example when the total film forming time (the number of film forming steps) in the substrate processing apparatus 100 exceeds a predetermined time (number), the exhaust characteristics adjusting process is performed again. That is, the exhaust characteristics adjusting process to be performed again is executed after the process of processing the wafer 200 is performed a predetermined number of times. Specifically, for example, after the film forming step S301 for a certain wafer 200 is completed and the wafer 200 is unloaded from the substrate processing apparatus 100, before a wafer 200 to be processed next is loaded into the substrate processing apparatus 100, the exhaust characteristics adjusting process is performed.

At this time, since the first data which is the reference data has already been acquired, the exhaust characteristics adjusting process may be started from the second data acquiring step S502. However, from the viewpoint of improving processing efficiency and preventing a decrease in a semiconductor device manufacturing throughput, it is also conceivable to acquire third data, as will be described below.

(Third Data Acquiring Step: S512)

Similar to the second data, the third data is actual measurement data on the exhaust characteristics. More specifically, in a state in which the valve opening degrees of the pressure regulator 227 and the valve opening degree of the exhaust regulating valve 228 are set to a predetermined value, the third data is acquired by measuring a pressure value (pressure data) with the pressure sensor 229 while the supply flow rate of the third gas (inert gas) from the third gas supply part 245 is changed. However, unlike the second data, the third data is acquired only at a preset specific point.

An example of the specific point may be one point providing the maximum flow rate (second flow rate) of the inert gas used in the process recipe. In that case, a pressure value corresponding to the maximum flow rate (that is, only a pressure value corresponding to the one point) is measured as the third data.

Another example of the specific point may be two points providing the minimum flow rate (first flow rate) and the maximum flow rate (second flow rate) of the inert gas used in the process recipe. In that case, pressure values corresponding to the minimum flow rate and the maximum flow rate (that is, only pressure values corresponding to the two points) are measured as the third data. In this way, when the pressure values of the two points are measured, the gradient data can be calculated by computation to allow detailed process checking.

An example of the pressure corresponding to the maximum flow rate used in the process recipe may be the pressure in the first purging step S204 or the second purging step S206. An example of the pressure corresponding to the minimum flow rate used in the process recipe may be the pressure at the time of supplying an inert gas (carrier gas) between the end of the supply of the first gas and the supply of the purge gas, among the first gas supplying step S203 and the first purging step S204.

In this manner, when the third data that is an alternative to the second data is obtained from the measurement results of only one point or only two points, the measurement time for acquiring the data can be shortened, thereby preventing a decrease in a semiconductor device manufacturing throughput. In addition, even in the case of shortening the measurement time, for example, when the measurement is performed on two points, the gradient data can be calculated, thereby preventing deterioration of the quality of process checking.

(Data Computing Step: S513)

After acquiring the third data, the third data is compared with the first data to obtain a difference therebetween as difference data. The processing at this time may be performed in the same way as in the case of the data computing step S503 for the second data.

(Determination Step: S514)

Once the difference data between the first data and the third data is obtained, it is determined whether or not the difference data is within a predetermined range. The processing at this time may be performed in the same manner as in the case of the determination step S504 for the second data.

When it is determined that the difference data is within the predetermined range (YES in S514), the process returns to the above-described step S511 where the series of substrate processing steps S201 to S208 including the film forming step S301 is performed.

(Valve Opening Degree Changing Step: S515)

On the other hand, when it is determined that the difference data is not within the predetermined range (NO in S514), a valve opening degree changing step S515 is performed. The processing at this time may be performed in the same manner as in the case of the valve opening degree changing step S508. After performing the valve opening degree changing step S515, the above series of steps is again repeated (S512 to S515) starting from the third data acquiring step S512. That is, the series of steps is repeated (S512 to S515) until the difference data falls within the predetermined range in the determination step S514.

Even when performing the valve opening degree changing step S515, the number of times counting step S505, the alarm notifying step S507 based on this step S505 and the valve opening degree checking step S509 and the like may be performed as in the case of the valve opening degree changing step S508.

(5) Effects According to the Present Embodiment

According to the present embodiment, one or more effects set forth below may be achieved.

(a) In the present embodiment, with respect to the exhaust characteristics affecting the processing on the wafer 200 in the process of substrate processing, it is determined whether or not the difference data between the first data as the reference data and the second data as the actual measurement data is within a predetermined range. When the difference data is not within the predetermined range, the valve opening degree of the exhaust regulating valve 228 is changed. That is, the exhaust characteristic are adjusted so that the exhaust characteristics at the time of exhausting the internal atmosphere of the process chamber 201 do not deviate from the reference characteristics (reference data) from which desired processing characteristics can be obtained. Therefore, it is possible to suppress a change in the exhaust characteristics in the substrate processing apparatus 100, which can result in improvement of the uniformity of processing for each wafer 200.

(b) In the present embodiment, in addition to the pressure regulator 227 that varies the valve opening degree according to the process recipe, the exhaust regulating valve 228 as an exhaust regulating part that varies the valve opening degree according to the exhaust characteristics modifying recipe is installed and used to adjust the exhaust characteristics. Therefore, for example, even in the case where a plurality of substrate processing apparatuses 100 are present, the valve opening degree of the exhaust regulating valve 228 is varied according to the exhaust characteristics modifying recipe for the exhaust characteristics adjusting process performed separately from the process of substrate processing, instead of the process recipe for the process of substrate processing unified for the substrate processing apparatuses 100, so that it is possible to adjust the exhaust characteristics individually depending on the situation of each substrate processing apparatus 100.

(c) In the present embodiment, the exhaust characteristics adjusting process is performed at a predetermined timing. As the predetermined timing, when the total film forming time (the number of times of film forming processes) in the substrate processing apparatus 100 exceeds a predetermined time (number of times), the exhaust characteristics adjusting process is performed. By performing the exhaust characteristics adjusting process at such a timing, variations in characteristics of each of a plurality of wafers 200 being continuously processed can be reduced.

(d) In the present embodiment, in the exhaust characteristics adjusting process, a series of steps starting from the second data acquiring step S502 is repeated (S502 to S509) until the difference data between the first data and the second data falls within the predetermined range. Therefore, the exhaust characteristics can be feedback-controlled so that the exhaust characteristics do not deviate from the reference characteristics, ensuring improvement of the uniformity of processing for each wafer 200.

(e) In the present embodiment, various data such as the second data are acquired in the exhaust characteristics adjusting process. The acquired various data can be accumulated in the memory device 260c, which can lead to preventive maintenance. Specifically, for example, by accumulating the gradient data on the second data, the situation of performance deterioration of the vacuum pump 223 can be inferred from a change in the gradient data, thereby making it possible to grasp a pump replacement timing. Further, for example, by accumulating the adjustment data of the valve opening degree of the exhaust regulating valve 228, the situation of clogging of the exhaust pipe 224 can be inferred from the adjustment data (valve opening degree), thereby making it possible to grasp a pipe cleaning timing.

(f) In the present embodiment, in the exhaust characteristics adjusting process, as necessary, at least one of the maintenance data indicating that maintenance of the exhaust part is required and the maintenance timing data indicating that the maintenance timing of the exhaust part is approaching is output to notify an alarm to the apparatus operator. Therefore, it is possible to prevent the adjustment of the valve opening degree of the exhaust regulating valve 228 from being repeated more than necessary, thereby preventing a reduction in throughput of a semiconductor device manufacturing process. In addition, it becomes possible to perform the maintenance in accordance with the alarm notification and thereby to promptly and appropriately eliminate the cause of pump performance deterioration and pipe clogging.

(g) As described in the present embodiment, in the exhaust characteristics adjusting process, by acquiring the third data which is an alternative to the second data, it is possible to shorten the measurement time for obtaining the data, thereby preventing a reduction in throughput of a semiconductor device manufacturing process.

Other Embodiments

While some embodiments of the present disclosure have been specifically described above, the present disclosure is not limited to the aforementioned embodiments but may be differently modified without departing from the subject matter of the present disclosure.

In the above embodiments, an example of the film forming process such as the CVD process for forming a $SiO_2$ film on a wafer surface as a process performed in the process of substrate processing is described. However, the present disclosure is not limited thereto. That is, in addition to the example of the film forming process described in the above embodiments, the present disclosure may be applied to a process of forming films other than the thin film described in the above embodiments. In addition, the present disclosure may be applied to other substrate processing such as heat treatment (annealing treatment), plasma treatment, diffusion treatment, oxidation treatment, nitridation treatment, lithography treatment and the like, in addition to the film forming process, irrespective of the specific contents of the substrate processing.

<Aspects of Present Disclosure>

Hereinafter, some aspects of the present disclosure will be additionally described as supplementary notes.

(Supplementary Note 1)

According to one aspect of the present disclosure, a method of manufacturing a semiconductor device includes: supplying an inert gas into a process chamber; exhausting the internal atmosphere of the process chamber from an exhaust part; acquiring first data serving as reference data on a relationship between a flow rate of the inert gas and a pressure in one of the process chamber or the exhaust part; processing a substrate accommodated in the process chamber by supplying a processing gas into the process chamber; and adjusting an exhaust characteristic by adjusting a valve opening degree of an exhaust regulating part installed in the exhaust part, wherein the act of the exhaust characteristics includes: acquiring second data, which is measurement data on a relationship between the flow rate of the inert gas and a pressure measured in one of the process chamber and the exhaust part, by measuring the pressure while varying the flow rate of the inert gas with the valve opening degree of the exhaust regulating part set to a predetermined value; determining whether or not difference data between the first data and the second data is within a predetermined range, the difference data being obtained by comparing the second data with the first data; and changing the valve opening degree of the exhaust regulating part when the difference data is not within the predetermined range.

(Supplementary Note 2)

The method of Supplementary Note 1, wherein the act of acquiring second data, the act of determining and the act of changing are repeated until the difference data falls within the predetermined range.

(Supplementary Note 3)

The method of Supplementary Note 2, further including outputting maintenance data indicating that maintenance of the exhaust part is required when a number of times that the difference data does not fall within the predetermined range exceeds a predetermined number of times.

(Supplementary Note 4)

The method of Supplementary Note 2 or 3, further including outputting maintenance timing data, indicating that a maintenance timing of the exhaust part approaches when a frequency of changing the valve opening degree of the exhaust regulating part so that the difference data falls within the predetermined range exceeds a predetermined frequency.

(Supplementary Note 5)

The method of any one of Supplementary Notes 1 to 4, wherein the act of adjusting the exhaust characteristics is performed after the act of processing the substrate is performed a predetermined number of times.

(Supplementary Note 6)

According to another aspect of the present disclosure, there is provided a program that causes a computer to perform a process of: in a substrate processing apparatus, supplying an inert gas into a process chamber; exhausting the internal atmosphere of the process chamber from an exhaust part; acquiring first data serving as reference data on a relationship between a flow rate of the inert gas and a pressure in one of the process chamber or the exhaust part; processing a substrate accommodated in the process chamber by supplying a processing gas into the process chamber; and adjusting exhaust characteristics by adjusting a valve opening degree of an exhaust regulating part installed in the exhaust part, wherein the act of adjusting the exhaust characteristics includes: acquiring second data, which is measurement data on a relationship between the flow rate of the inert gas and a pressure in one of the process chamber or the exhaust part, by measuring the pressure while varying the flow rate of the inert gas with the valve opening degree of the exhaust regulating part set to a predetermined value; determining whether or not difference data between the first data and the second data is within a predetermined range, the difference data being obtained by comparing the second data with the first data; and changing the valve opening degree of the exhaust regulating part when the difference data is not within the predetermined range.

(Supplementary Note 7)

According to another aspect of the present disclosure, there is provided a non-transitory computer-readable recording medium storing a program that causes a computer to perform a process of: in a substrate processing apparatus, supplying an inert gas into a process chamber; exhausting an internal atmosphere of the process chamber from an exhaust part; acquiring first data serving as reference data on a relationship between a flow rate of the inert gas and a pressure in one of the process chamber or the exhaust part; processing a substrate accommodated in the process chamber by supplying a processing gas into the process chamber; and adjusting exhaust characteristics by adjusting a valve opening degree of an exhaust regulating part installed in the exhaust part, wherein the act of adjusting the exhaust characteristics includes: acquiring second data, which is measurement data on a relationship between the flow rate of the inert gas and a pressure measured in one of the process chamber or the exhaust part, by measuring the pressure while varying the flow rate of the inert gas with the valve opening degree of the exhaust regulating part set to a predetermined value; determining whether or not difference data between the first data and the second data is within a predetermined range, the difference data being obtained by comparing the second data with the first data; and changing the valve opening degree of the exhaust regulating part when the difference data is not within the predetermined range.

(Supplementary Note 8)

According to another aspect of the present disclosure, there is provided a substrate processing apparatus including: a process chamber in which a substrate is accommodated; a processing gas supply part configured to supply a processing gas into the process chamber; an inert gas supply part configured to supply an inert gas into the process chamber; an exhaust part configured to exhaust the internal atmosphere of the process chamber, wherein the exhaust part includes an exhaust regulating part configured to vary a valve opening degree at the time of the exhaust; a pressure measuring part configured to measure a pressure in one of the process chamber or the exhaust part; a first data acquiring part configured to acquire first data serving as reference data on a relationship between a flow rate of the inert gas and the pressure in one of the process chamber or the exhaust part; and an exhaust characteristics adjusting part configured to adjust the valve opening degree of the exhaust regulating part of the exhaust part, wherein the exhaust characteristics adjusting part includes: a second data acquiring part configured to acquire second data, which is measurement data on a relationship between the flow rate of the inert gas and the pressure in one of the process chamber or the exhaust part, by measuring the pressure while varying the flow rate of the inert gas supplied by the inert gas supply part with the valve opening degree of the exhaust regulating part set to a predetermined value; and an adjustment control part configured to obtain difference data between the second data and the first data by comparing the second data with the first data, determine whether or not the difference data is within a predetermined range, and change the valve opening degree of the exhaust regulating part when the difference data is not within the predetermined range.

According to the present disclosure in some embodiments, it is possible to improve the processing uniformity for each substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:

supplying an inert gas into a process chamber;

exhausting an internal atmosphere of the process chamber from an exhaust part;

acquiring first data serving as reference data on a relationship between a flow rate of the inert gas and a pressure in one of the process chamber or the exhaust part;

processing a substrate accommodated in the process chamber by supplying a processing gas into the process chamber; and adjusting exhaust characteristics by adjusting a valve opening degree of an exhaust regulating part installed in the exhaust part, wherein the act of adjusting the exhaust characteristics includes:

acquiring second data, which is measurement data on a relationship between the flow rate of the inert gas and a pressure measured in one of the process chamber or the exhaust part, by measuring the pressure while varying the flow rate of the inert gas with the valve opening degree of the exhaust regulating part set to a predetermined value;

determining whether or not difference data between the first data and the second data is within a predetermined range, the difference data being obtained by comparing gradient data on the second data with gradient data on the first data; and changing the valve opening degree of the exhaust regulating part when the difference data is not within the predetermined range, such that the gradient data on the second data approaches the gradient data on the first data.

2. The method of claim 1, wherein the act of acquiring the second data, the act of determining and the act of changing are repeated until the difference data falls within the predetermined range.

3. The method of claim 2, further comprising outputting maintenance data indicating that maintenance of the exhaust part is required when a number of times that the difference data does not fall within the predetermined range exceeds a predetermined number of times.

4. The method of claim 3, further comprising outputting maintenance timing data indicating that a maintenance timing of the exhaust part approaches when a frequency of changing the valve opening degree of the exhaust regulating part so that the difference data falls within the predetermined range exceeds a predetermined frequency.

5. The method of claim 4, wherein the act of adjusting the exhaust characteristics is performed after the act of processing the substrate is performed a predetermined number of times.

6. The method of claim 3, wherein the act of adjusting the exhaust characteristics is performed after the act of processing the substrate is performed a predetermined number of times.

7. The method of claim 2, further comprising outputting maintenance timing data, indicating that a maintenance timing of the exhaust part approaches when a frequency of changing the valve opening degree of the exhaust regulating part so that the difference data falls within the predetermined range exceeds a predetermined frequency.

8. The method of claim 7, wherein the act of adjusting the exhaust characteristics is performed after the act of processing the substrate is performed a predetermined number of times.

9. The method of claim 2, wherein the act of adjusting the exhaust characteristics is performed after the act of processing the substrate is performed a predetermined number of times.

10. The method of claim 1, wherein the act of adjusting the exhaust characteristics is performed after the act of processing the substrate is performed a predetermined number of times.

* * * * *